United States Patent [19]

Fortune

[11] Patent Number: 5,339,519
[45] Date of Patent: Aug. 23, 1994

[54] METHOD OF COOLING AN ELECTRICAL DEVICE USING A HEAT SINK ATTACHED TO A CIRCUIT BOARD CONTAINING HEAT CONDUCTIVE LAYERS AND CHANNELS

[75] Inventor: G. Clark Fortune, Farmington Hills, Mich.

[73] Assignee: Eaton Corporation, Cleveland, Ohio

[21] Appl. No.: 63,199

[22] Filed: May 18, 1993

Related U.S. Application Data

[62] Division of Ser. No. 898,369, Jun. 15, 1992, Pat. No. 5,258,887.

[51] Int. Cl.$^5$ .......................... H05K 3/34; H05K 7/20
[52] U.S. Cl. ........................................ 29/840; 29/843; 174/16.3; 257/718
[58] Field of Search .................. 29/832, 840, 843; 174/16.3, 252; 165/80.3, 185; 257/706, 707, 713, 718, 719, 720; 361/720, 792, 400, 405, 414; 228/44.7, 212

[56] References Cited

U.S. PATENT DOCUMENTS

| | | | |
|---|---|---|---|
| 4,535,385 | 8/1985 | August et al. | 361/388 |
| 4,547,834 | 10/1985 | Dumont et al. | 361/386 |
| 4,729,061 | 3/1988 | Brown | 361/386 |
| 4,810,563 | 3/1989 | DeGree et al. | 428/209 |
| 5,043,845 | 8/1991 | McDermott et al. | 361/387 |
| 5,155,661 | 10/1992 | Nagesh et al. | 361/386 |

*Primary Examiner*—Peter Dungba Vo
*Attorney, Agent, or Firm*—Loren H. Uthoff, Jr.

[57] ABSTRACT

A method of attaching a heat sink to a circuit board for cooling an electrical device mounting system employing a plurality of heat conductive layers embedded in a printed circuit board where heat conduction therebetween is facilitated by a plurality of heat conduction channels passing through one layer to another where the heat generated by the semiconductor device is conducted into the conducting layers via the heat conduction channels and into a heat dissipation device, such as an aluminum heat sink.

6 Claims, 1 Drawing Sheet ered sequentially. Also, the prior art methods do not generate sufficient clamping loads on the electrical device to establish a good thermal conductivity between the heat conductive thermal pad and the heat sink. It is desirable to have a large contact area between the semiconductor thermal pad and the heat sink to maximize the heat transfer and the cooling effect. Prior art methods, such as that described in U.S. Pat. No. 4,479,140, U.S. Pat. No. 5,089,936, and U.S. Pat. No. 5,258,887 filed on Jun. 15, 1992 assigned to the same assignee as the present application, the disclosures of which are hereby incorporated by reference, describe methods to use springs to assure contact between a semiconductor device and the heat sink.

METHOD OF COOLING AN ELECTRICAL DEVICE USING A HEAT SINK ATTACHED TO A CIRCUIT BOARD CONTAINING HEAT CONDUCTIVE LAYERS AND CHANNELS

This is a divisional of copending application Ser. No. 07/898,369 filed on Jun. 15, 1992, now U.S. Pat. No. 5,258,887.

RELATED APPLICATIONS

The present application relates to U.S. Pat. No. 5,258,887, entitled ELECTRICAL DEVICE COOLING SYSTEM USING A HEAT SINK ATTACHED TO A CIRCUIT BOARD CONTAINING HEAT CONDUCTIVE LAYERS AND CHANNELS, filed on Jun. 15, 1992 and assigned to the same assignee, Eaton Corporation, as this application.

1. Field of the Invention

This invention relates to a method of mounting a power electrical device to a printed circuit board having a heat dissipation device attached to the opposite side of the board. More specifically, the present invention relates to a method of mounting a power electrical device to a circuit board where the heat generated by the device is conducted into a heat sink located on the opposite side of the printed circuit board through a plurality of heat conduction channels and further conducted and dissipated by a plurality of heat conducting layers within the printed circuit board.

2. Background of the Invention

It is common to use a heat dissipation device, one type being commonly known as a heat sink, which is placed in contact with the back surface of an electrical device such as a semiconductor for effectuating a cooling function to prevent an over temperature condition of the device when operating at high power levels. The device is attached to the heat sink usually using a multiplicity of fasteners which require very accurate machining and a high degree of assembly labor especially when a large number of devices are sequentially mounted.

Heat conduction is improved with the use of a solder or a heat conductive paste applied to the mounting side of a thermal pad which is a part of the semiconductor device and is usually bolted to a heat sink through a hole in the flange of the thermal pad. The thermal pad is attached to the device active elements and functions as a heat conductive plate whose purpose is to conduct the heat generated by the elements and is directly attached to a larger more effective heat dissipator, such as a heat sink, which requires a large amount of space on the printed circuit board.

It is also known to use a cooling jacket to cool the devices where the devices themselves are immersed in a cooling fluid or the devices are attached and in thermal contact with a heat sink which contains one or more cooling channels wherein a cooling fluid is forcibly circulated.

Problems have arisen when the electrical device, such as a power semiconductor, is mounted to a circuit board for cooling by heat transferred through the heat conductive thermal pad and where electrical connection leads that emanate from the device are attached to connection pads, known as solder pads, on the printed circuit board. To obtain adequate cooling, an auxiliary heat sink must be added in some manner to effectively conduct additional heat from the thermal pad of the electrical device to control the operating temperature.

It is known to mount the semiconductor directly to a heat sink having fins which extend into the surrounding air and are mounted to the printed circuit board, however, this approach is not conducive to high packaging density on the printed circuit board itself since the heat sink requires a large area which results in a larger overall size of the electronics module. It is thus desirable to provide a method of mounting the heat sink such that it can effectively conduct heat away from the semiconductor device while allowing for dense packaging of the electrical components on the printed circuit board with a minimum number of fasteners and a relaxation of the geometric tolerances involved.

The stringent geometric requirements and accuracy of the prior art methods and high labor content are not conducive to high volume manufacturing assembly of the printed circuit board where the heat sink is mounted directly to the semiconductor device increasing cost especially where a multiplicity of devices are mounted sequentially. Also, the prior art methods do not generate sufficient clamping loads on the electrical device to establish a good thermal conductivity between the heat conductive thermal pad and the heat sink. It is desirable to have a large contact area between the semiconductor thermal pad and the heat sink to maximize the heat transfer and the cooling effect. Prior art methods, such as that described in U.S. Pat. No. 4,479,140, U.S. Pat. No. 5,089,936, and U.S. Pat. No. 5,258,887 filed on Jun. 15, 1992 assigned to the same assignee as the present application, the disclosures of which are hereby incorporated by reference, describe methods to use springs to assure contact between a semiconductor device and the heat sink.

These methods are effective but require additional parts, such as springs, mounting bolts and a retention block. Prior art devices do not allow for the semiconductor device to be mounted directly on the circuit board so that the electrical leads can be soldered to the printed circuit board soldering pads to minimize induced stresses either at the solder pads or along the electrical leads themselves while allowing for high clamping loads to maximize the heat conduction and into the heat sink. Also, the heat sink is mounted on the same side of the circuit board as the semiconductor device which does not allow for optimum location of the electrical components for dense packaging and complicates the assembly process.

SUMMARY OF THE INVENTION

The present invention provides a method of mounting a power electrical device such as a semiconductor directly to a printed circuit board by soldering the heat conduction thermal pad of the semiconductor device to the surface of the board where the electrical leads emanating therefrom are soldered to individual solder pads which are electrically connected to the other electrical components located on the board. The heat generated by the semiconductor device when in operation is conducted through a plurality of heat conductive layers, one located on the top surface of the board and to which the semiconductor thermal pad is mounted, and one on the bottom surface with the balance evenly spaced therebetween and embedded in the board. A plurality of heat conduction channels transverse to the layers are used to conduct the heat from layer to layer and finally to the heat conduction layer that is located on the bottom side of the printed circuit board. The heat that is conducted through the heat conduction channels and into the heat conduction layer located on the bottom of the circuit board is then transferred through a compliant electrically insulating layer which has a relatively high thermal coefficient of conductivity into a heat sink which is commonly made out of an aluminum block which can include fins to maximize the radiated heat transferred into the surrounding air. In this manner, the semiconductor device can be simply mounted on the top surface of a printed circuit board without the use of springs and fasteners while allowing the electrical leads to be soldered to solder pads on the circuit board thereby minimizing mechanical stresses when high temperatures are encountered. The circuit board is clamped to the heat sink with relatively large mounting bolts positioned between the semiconductor devices and aligned with the center axis of the heat conduction channels to produce high clamping forces to maximize heat transfer.

A provision of the present invention is to provide for a method of conducting the heat generated from an electrical device through a plurality of heat conduction layers and heat conducting channels into a heat sink that is mounted on the opposite side of a printed circuit board from the other components.

Another provision of the present invention is to maximize the component density of a printed circuit board by allowing the heat dissipative members, such as a heat sink, to be mounted on a bottom side of a printed circuit board where the electrical components are mounted on top side of the printed circuit board.

Another provision of the present invention is to allow for relatively high clamping loads to be introduced between the heat sink and the circuit board to provide for a high level of heat conductivity between a heat conducting layer and the heat sink.

Still another provision of the present invention is to allow for a method of cooling an electrical device, which is mounted to a circuit board and in turn mounted to a heat sink, using a minimum of mechanical fasteners for ease of assembly.

DETAILED DESCRIPTION OF THE PREFERRED EMBODIMENTS

Figure 1:
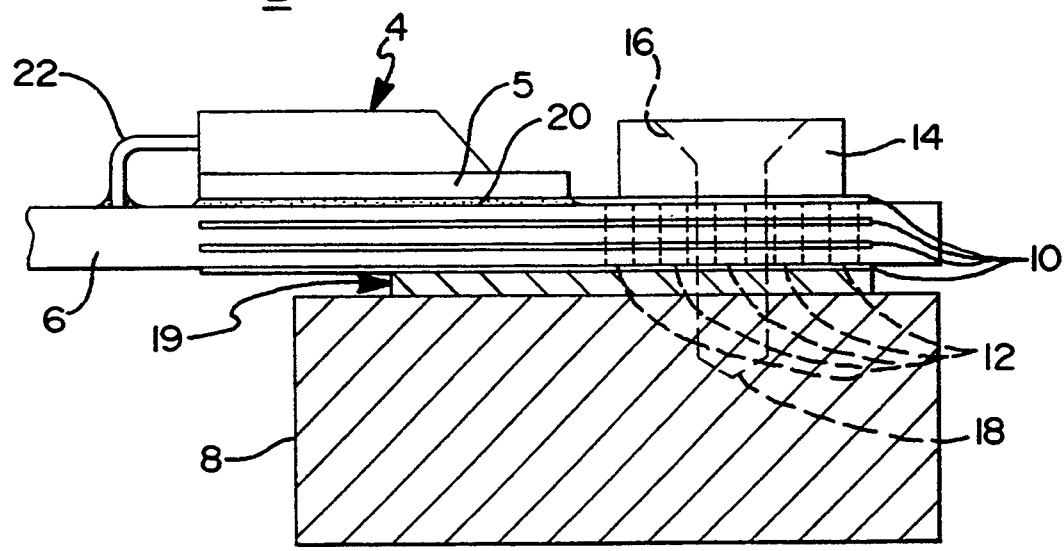
FIG. 1 is a sectional view of the present invention showing a semiconductor device mounted to a circuit board which is securely clamped to a heat sink.
Figure 2:
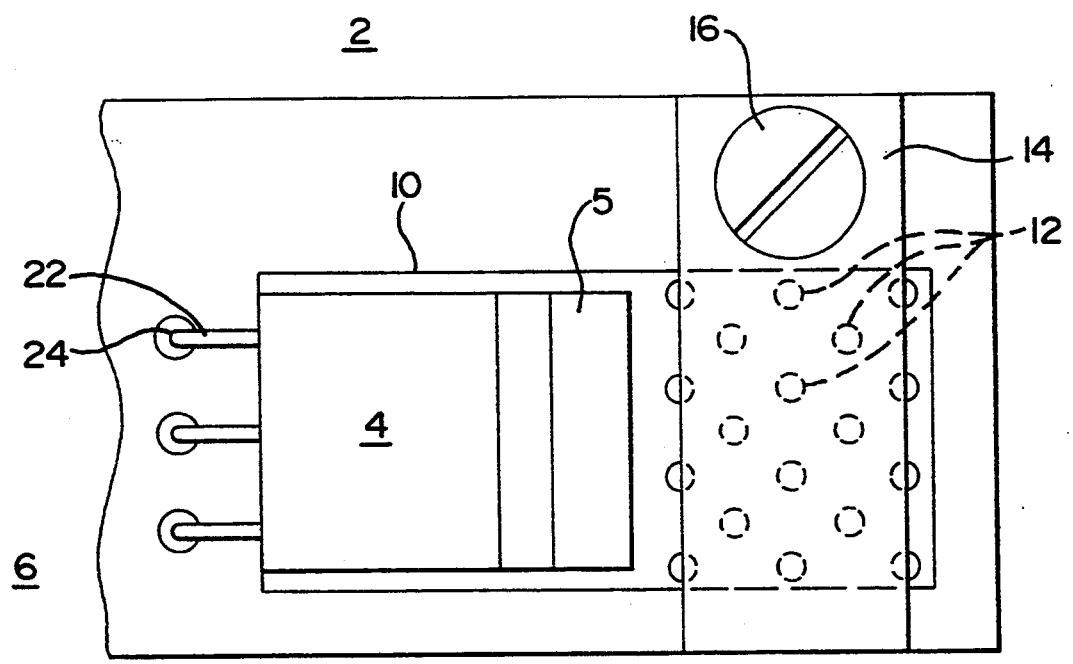
FIG. 2 is a top view of FIG. 1 showing the method of mounting a semiconductor device of the present invention.

In accordance with the present invention, as shown most clearly in FIGS. 1 and 2, at least one electrical device such as semiconductor device 4 having an integral heat conduction pad 5 is mounted to a printed circuit board 6 where the assembly thereof is secured to a heat dissipating device, such as an aluminum heat sink 8, which functions to dissipate heat generated by the semiconductor device 4. The generated heat passes through the printed circuit board 6 into the heat sink 8 which is then dissipated into the surrounding air usually by means of a plurality of fins formed in the heat sink. Other methods can be used to conduct the heat, such as a forced circulation of liquid through the heat dissipation device. All of these heat dissipation devices function to maintain a proper operating temperature of the semiconductor device 4 so that temperature extremes are not encountered which can degrade the performance of the semiconductor device 4 or cause failure either immediately or over a period of time.

The printed circuit board 6 contains a plurality of heat conducting layers 10 which can be made of a material having a high value of thermoconductivity such as copper. The surface of the heat conduction layers are approximately parallel to the top and bottom surfaces of the printed circuit board 6. FIG. 1 shows a printed circuit board 6 having a copper layer 10 on a top surface and a bottom surface of the printed circuit board 6 and also two layers evenly spaced therebetween and embedded within the printed circuit board 6 which function to conduct heat and distribute heat one to the other through a plurality of heat conduction channels 12 whose axis lie approximately perpendicular to the surface of the heat conducting layers 10. The heat conduction channels 12 are preferably formed by drilling or punching a plurality of holes into and through the printed circuit board 6 and then filling those holes with a heat conductive material such as solder. The heat conduction channels 12 function to transfer heat by conduction from one heat conducting layer 10 to another and finally into the heat sink 8 for dissipation into the atmosphere.

FIG. 2 more clearly shows the diameter of the heat conduction channels 12 which are maximized in area to provide for a more effective heat conduction from the semiconductor device 4 into the heat conduction thermal pad 5 which is attached to the printed circuit board 6 using semiconductor mounting solder 20 and finally into a first heat conducting layer 10 where the heat conduction channels 12 transfer the heat to each conducting layer 10 and finally through a heat conductive electrical insulator 19 and into the heat sink 8.

The printed circuit board 6 is held firmly to the heat sink 8 through the heat conductive electrical insulator 19 clamped between the printed circuit board 6 and the heat sink 8 by a mechanical clamping fastener 16, which can be a mechanical screw, which engages a threaded opening 18 located in the heat sink 8. The mechanical clamping fastener 16 also engages a clamping plate 14 passing through a hole therein where the clamping plate 14 improves the distribution of the clamping load generated by the mechanical clamping fastener 16. Very high clamping loads can be induced by the clamping fastener 16 and are desirable to provide for effective heat transfer.

The function of the heat conductive electrical insulator 19 is to electrically insulate the printed circuit board 6 from the heat sink 8 where these two elements are commonly at different levels of electrical potential and must be electrically insulated while allowing for heat transfer from the printed circuit board 6 into the heat sink 8 for thermal control.

The semiconductor device 4 often contains a plurality of electrical leads 22 which extend and engage holes in the printed circuit board 6 and are soldered to solder pads 24 which are in turn connected to a plurality of other electrical devices located on the printed circuit board 6.

Using the present invention, a series of semiconductor devices 4 can be conveniently mounted onto the top surface of a printed circuit board 6 where the heat sink 8 is mounted to the bottom surface of the printed circuit board thereby allowing for a very dense packaging thereby minimizing the size of the printed circuit board 6.

Where a multiplicity of semiconductor devices 4 are mounted, a clamping fastener 16 is preferably located between each pair of semiconductor devices 4 which provide in combination with the clamping plate 14 for high clamping loads thereby maximizing the heat transfer from the printed circuit board 6 and the heat conducting layers 10 into the heat sink 8. The clamping fasteners 16 are approximately aligned with the central axis of the section of the heat conductive layer containing the heat conductive channels.

It will be appreciated by those of ordinary skill in the art that many variations in the foregoing preferred embodiments are possible while remaining within the scope of the present invention. The present invention should thus not be considered limited in the preferred embodiments where the specific choices of materials, configurations, dimensions, applications or ranges of parameters employed therein.

What is claimed is:

1. A method of cooling an electrical device comprising:

providing a heat dissipation means;

providing a printed circuit board containing a plurality of heat conduction layers, a first layer located on a top surface of said printed circuit board and a second layer located on a bottom surface of said printed circuit board with the remaining heat conduction layers located between said top surface and said bottom surface and embedded within said printed circuit board, said heat conduction layers each having a planar surface substantially parallel to the top and bottom surfaces of said printed circuit board;

providing a plurality of heat conduction channels transverse to and passing through said heat conduction layers, said heat conduction channels extending from said first layer to said second layer;

providing a clamping means directly overlying said heat conduction layers and heat conduction channels and providing a clamping force between said printed circuit board and said heat dissipation means;

mounting said electrical device to said top surface of said printed circuit board; and clamping said printed circuit board to said heat dissipation means with said clamping means where said heat dissipation means is mounted to said bottom surface of said printed circuit board.

2. The method of cooling an electrical device of claim 1, further comprising:

providing a thermally conductive electrical insulating layer; and clamping said insulating layer between said printed circuit board and said heat dissipation means.

3. The method of cooling an electrical device of claim 1, further comprising:

soldering said electrical device to said printed circuit board.

4. The method of cooling an electrical device of claim 1, further comprising:

forming said heat conduction channels by drilling a plurality of holes substantially perpendicular to said top surface of said printed circuit board and then filling said holes with solder.

5. The method of cooling an electrical device of claim 1, wherein said heat dissipation means is an aluminum heat sink.

6. The method of cooling an electrical device of claim 1, wherein said clamping means is comprised of a clamping plate and a threaded fastener passing through said clamping plate and said printed circuit board then engaging said heat dissipation means.

* * * * *